United States Patent

[11] 3,568,134

[72] Inventors John W. Anhalt
La Crescenta;
John V. Lane, Granada Hills, Calif.

[21] Appl. No. 816,865
[22] Filed Mar. 3, 1969
Division of Ser. No. 658,258, Aug. 3, 1967.
[45] Patented Mar. 2, 1971

[73] Assignee International Telephone and Telegraph Corporation
New York, N.Y.

[54] PACKAGING AND ACTUATING SYSTEM FOR PRINTED CIRCUIT BOARDS AND ELECTRICAL CONNECTOR ASSEMBLIES
2 Claims, 9 Drawing Figs.

[52] U.S. Cl. .......... 339/75, 339/176
[51] Int. Cl. .......... H01r 13/54
[50] Field of Search .......... 339/74, 75, 176

[56] References Cited

UNITED STATES PATENTS

| | | | |
|---|---|---|---|
| 2,654,872 | 10/1953 | Saul et al. | 339/75(M) |
| 2,793,354 | 5/1957 | Heimbach | 339/198 |
| 3,120,988 | 2/1964 | Gilbert | 339/176(MP) |
| 3,149,897 | 9/1964 | Martineck | 339/176(MF) |
| 3,188,598 | 6/1965 | Pferd | 339/17 |

*Primary Examiner*—Marvin A. Champion
*Assistant Examiner*—Joseph McGlynn
*Attorneys*—C. Cornell Remsen, Jr., Rayson P. Morris, Percy P. Lantzy and Paul W. Hemminger

ABSTRACT: Printed circuit boards and electrical connectors provide convenient means of assembling circuits in electronic equipment. A packaging system is provided in which printed circuit boards or plug-type electrical connectors may be inserted into a system with zero insertion force. After the printed circuit boards or electrical connectors are supported in a rack, cam-actuated electrical contacts supported on the rack are actuated to make electrical contact with associated contact terminals on the printed circuit board or electrical connector plug. The packaging system includes cam support bars forming journals for cam shafts which actuate the electrical contacts, and contact carrier members releasably support electrical contacts in operative relation to the cam shafts. A rack and pinion mechanism interconnects individual cam shafts to effect simultaneous displacement of the electrical contacts to engage the associated printed circuit boards or electrical plug connectors.

Inventors
JOHN W. ANHALT
JOHN V. LANE
BY [signature] Attorney

PATENTED MAR 2 1971

3,568,134

Inventors
JOHN W. ANHALT
JOHN V. LANE
BY [signature] Attorney

Inventors
JOHN W. ANHALT
JOHN V. LANE
By
Attorney

PACKAGING AND ACTUATING SYSTEM FOR PRINTED CIRCUIT BOARDS AND ELECTRICAL CONNECTOR ASSEMBLIES

This application is a division of copending application, Ser. No. 658,258 filed on Aug. 3, 1967, for "Packaging and Actuating System for Printed Circuit Boards and Electrical Connector Assemblies."

This invention relates to packaging systems for printed circuit boards and actuating mechanisms for electrical connector assemblies, and particularly to a packaging system in which the insertion force required to insert a printed circuit board or plug connector into the system is substantially zero.

BACKGROUND OF THE INVENTION

The advent of computer technology, and the utilization of computer technology in the design and development of electronic equipment has increased many fold the numbers of printed circuit boards and other connector assemblies utilized in electronic equipments. Complete and functional modular circuits may be mounted on a single circuit board and associated with other circuit boards each of which carries a functional modular circuit. The combination of cooperatively related circuit boards form a complete electronic component. Electrical connection is made to the contact terminals on each circuit board or plug connector through resilient metallic contact members supported on a contact carrier member. Conventional circuit board and plug connector sockets usually utilize opposed resilient contacts normally biased toward the circuit board or plug connector and are arranged to be impinged upon by the edge of the circuit board or plug when inserted into the socket. One difficulty presented by this conventional-type electrical socket is that the force required to be imposed on the circuit board or plug to effect displacement of the resilient contact fingers is excessive, making it difficult to insert a circuit board or plug, and imposing forces on the circuit board or plug which might better be eliminated. It is accordingly one of the objects of the present invention to provide a packaging system and electrical socket assembly into which circuit boards or electrical plug connectors may be inserted without the exertion of any force whatsoever.

Another problem frequently encountered with conventional packaging systems is that the edge of a circuit board or of a plug connector is utilized as a wedge to effect displacement of the resilient contacts within the socket body. Such wedging action causes abrasion, resulting in wear and eventual destruction of the circuit board or plug connector. Therefore, it is another object of the invention to provide a packaging system and socket assembly in which there is no physical contact between the electrical contact fingers in the socket and the contact terminals on the printed circuit board or plug connector during insertion.

In the assembly of electronic components it is frequently desirable to arrange the various subassemblies into modules which may be separately assembled and combined with complementary modules to form a composite entity. It is desirable that a printed circuit board packaging system or connector assembly have as one of its characteristics the versatility to be expanded or contracted to accommodate numerous separate printed circuit board assemblies or plug connectors. Since each printed circuit board or plug connector requires that a separate set of electrical connections be made therewith, it is common practice to provide a separate electrical socket in association with each separate printed circuit board or plug connector. It is therefore a still further object of the invention to provide a packaging system which may easily be expanded or contracted by adding or subtracting electrical contact carrier members or sockets in accordance with the number of circuit boards or plug connectors to be utilized in a given system.

Versatility in a packaging system is not wholly dependent upon the ability to expand and contract the system, however. Another factor which determines versatility in a packaging system involves the ability to effect electrical contact with printed circuit boards or plug connectors added to an existing system in the same manner that electrical contact is made with the circuit boards or plug connectors making up the existing system. It is therefore another object of the invention to provide a contact carrier cam support subassembly in an electrical connector assembly in which the individual cam means may be joined together by rack and pinion means to effect simultaneous engagement of all the electrical contact elements in all the electrical connectors with all of the contact terminals on all the circuit boards or plug connectors supported in the packaging system.

It is desirable that cooling air be circulated through printed circuit board files, and in and about the individual circuit boards, when the circuits are energized. It is therefore a still further object of the invention to provide a circuit board packaging system in which the system permits attachment of a blower to the file and the passage of cooling air therethrough.

It is a still further object of the invention to provide an electrical connector subassembly of the socket type which may be used interchangeably with printed circuit boards and plug connectors utilizing flat and cylindrical terminal members.

The invention possesses other objects and features of advantage, some of which, with the foregoing, will become apparent from the following description and the drawings. It is to be understood however that the invention is not limited by such description and drawings, as it may be embodied in various forms within the scope of the appended claims.

SUMMARY OF THE INVENTION

Achievement of versatility in the packaging system described above is accomplished by fabricating the file to provide parallel side support members apertured to provide passages for cooling air, with each aperture flanged to provide an integral guideway for the edge of a printed circuit board. The apertured side members are held apart in parallel spaced relation by suitable end plates. Closing the bottom of the rectangular boxlike frame thus formed is an electrical connector assembly including a multiplicity of contact carrier members arranged in a side-by-side relationship, and having disposed across opposite ends a cam support rail secured to the end plates. Suitable resilient contact fingers are supported in aligned series in each contact carrier member, and camshafts journaled in the cam support rails are cooperatively disposed between adjacent rows of electrical contacts to effect lateral displacement and engagement thereof with an associated printed circuit board or plug connector upon rotation of "ganged" camshafts for simultaneous displacement of all the electrical contacts in the system. It is of course apparent that the electrical socket connector subassembly may be used in conjunction with plug connectors supporting individual electrical conductors rather than printed circuit boards by omitting the apertured side support members.

DESCRIPTION OF PREFERRED EMBODIMENT

Figure 1:
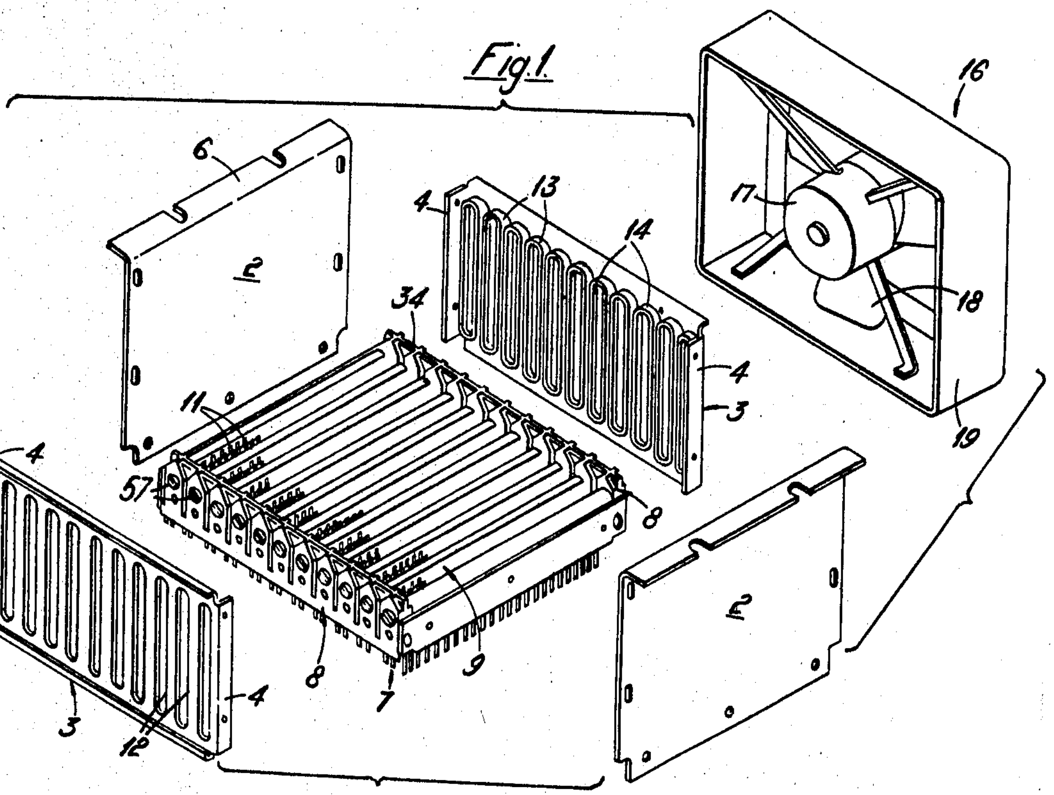
FIG. 1 is a perspective view of one embodiment exploded to reveal the individual subassemblies and parts making up a complete module of a packaging system and connector assembly for printed circuit boards.

In terms of greater detail, the packaging system forming the subject matter of this invention is described hereinafter primarily as it applies to printed circuit boards. Considered from this aspect, and referring to FIGS. 1 and 2, the packaging system comprises a modular package including rigid metallic end plates 2, spaced apart and held parallel by apertured side support members 3, each side support member having an inturned flange 4 adapted to be secured to an edge portion of opposed and parallel end plates by suitable screws (not shown). Each end plate is provided with an outwardly extending mounting flange 6 adapted to be secured to a supporting structure. Secured adjacent the bottom edge portions of end plates 2 and side support members 3 is an electrical socket connector assembly designated generally by the numeral 7. The electrical socket connector assembly includes a pair of parallel-spaced cam support bars 8, opposed ends of which are secured to the end plates 2 by appropriate means, such as screws. Disposed in juxtaposed relationship between the spaced cam support bars 8 are a plurality of electrical contact support socket members 9, each electrical contact support member 9 being adapted to receive and removably support at least one series of resilient metallic electrical contact members or conductors 11.

As shown best in FIG. 1, each side support member 3 is provided with elongated and transversely extending apertures 12, each aperture being framed by an inwardly projecting peripheral flange 13. The apertures and flanges are spaced apart and proportioned so that adjacent flanges on adjacent apertures define between them a passageway 14 into which an edge portion of a printed circuit board may be inserted and guided. The flanges function also to lend rigidity to the side support member, while the apertures function to lighten the construction and permit the passage of air between the printed circuit boards supported within the rack or file. To effect forced cooling of the printed circuit boards, a blower 16 is provided, equipped with a motor 17, a fan 18, and a frame 19 enclosing the fan and motor and adapted to be secured on one side of the rack in a manner to force air therethrough when the blower is energized.

Figure 2:
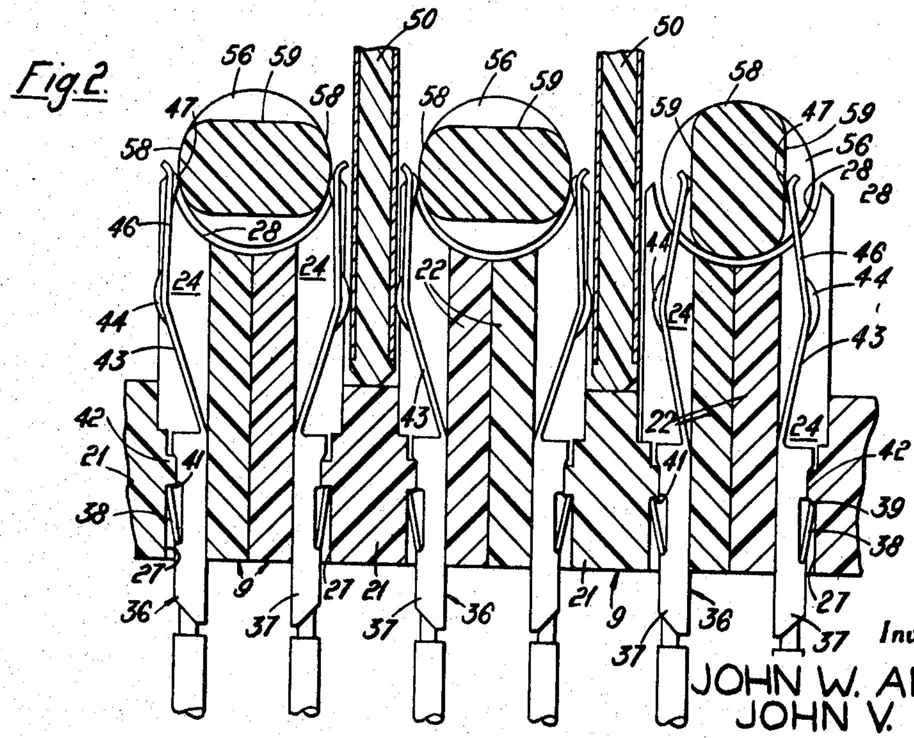
FIG. 2 is a fragmentary cross-sectional view of the electrical socket connector subassembly illustrating the relationship between the resilient contact fingers carried by each contact carrier member forming a socket, the printed circuit board inserted therein, and the camshafts utilized to displace the resilient contact fingers.
Figure 3:
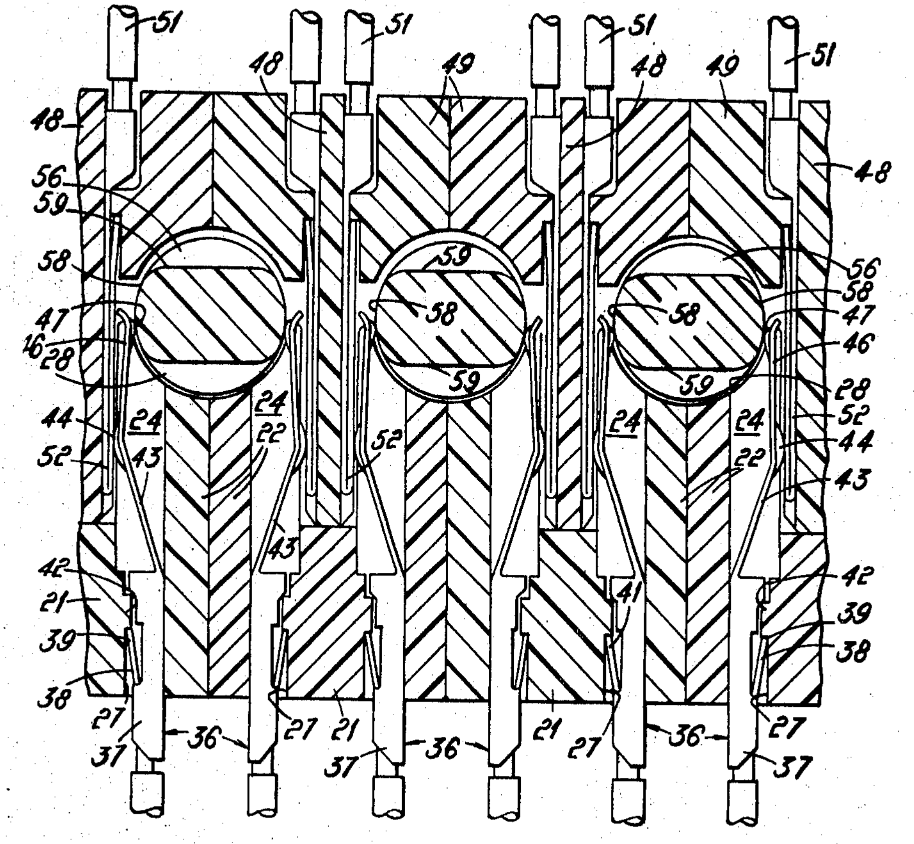
FIG. 3 is a fragmentary cross-sectional view similar to FIG. 2 but illustrating an embodiment in which plug connectors supporting individual electrical conductors in the form of flat blades are substituted for printed circuit boards.
Figure 4:
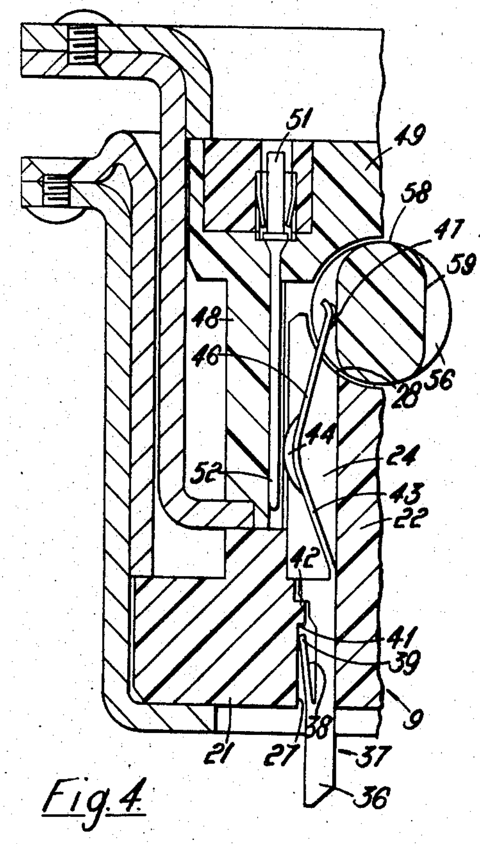
FIG. 4 is a fragmentary cross-sectional view of still another embodiment in which cylindrical pin-type electrical terminal members are supported on plug connector bodies inserted into the contact carrier socket members forming a part of the electrical socket connector subassembly.
Figure 6:
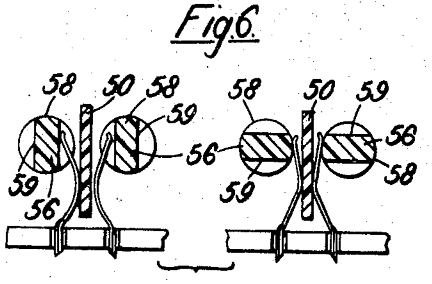
FIG. 6 is a composite schematic view illustrating the relationships between cams, printed circuit board, and electrical contacts in the "cam open" and "cam closed" positions.
Figure 9:
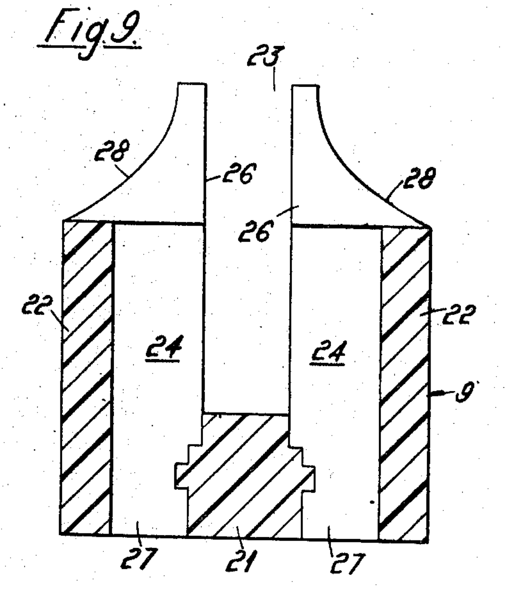
FIG. 9 is a vertical cross-sectional view of an individual contact carrier socket member taken in the plane indicated by the line 9–9 in FIG. 8.
Figure 8:
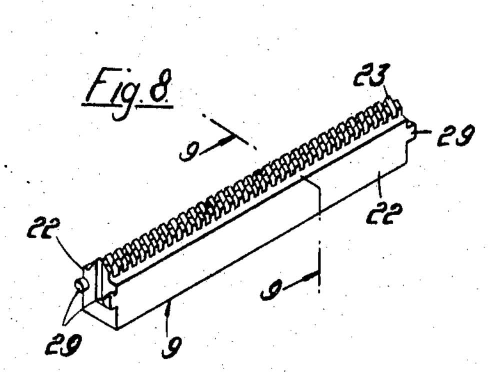
FIG. 8 is a perspective view of a contact carrier socket member shown apart from the electrical connector subassembly and before electrical contact members have been inserted thereinto.

Referring to FIGS. 2, 3 and 4, each of the electrical contact support members 9 is preferably fabricated from a synthetic resinous material possessing a high dielectric constant, and having desirable dimensional stability through a wide range of temperatures. Each contact carrier member (FIGS. 9 8 and 9) comprises an elongated bar having a generally U-shaped cross section to provide a bottom wall 21 joined by upstanding sidewalls 22 spaced apart to provide a passageway 23 therebetween proportioned to snugly receive an edge portion of a printed circuit board as shown in FIG. 2, or blade portion of a plug connector as shown in FIGS. 3 and 4. Each sidewall of the contact carrier member is provided with a series of longitudinal spaced transversely extending integral partitions 24, shown best in FIGS. 8 and 9. The free edges 26 of opposed partitions define the passageway 23 which extends the full length of the elongated contact carrier member. The adjacent partitions in each series define a series of juxtaposed grooves or passageways 27 which extend through bottom wall 21. As shown best in FIG. 9, an edge portion of each partition extends beyond the free end of the associated sidewall and is provided with a concave surface 28 proportioned so that when two contact carrier members are abutted (FIG. 2) the concave surfaces of back-to-back partitions possess a common center of revolution. At each opposed end, as shown best in FIG. 8, each elongated contact carrier member is provided with longitudinally extending lugs 29, utilized to support each contact carrier member in a precise position in the electrical connector assembly in a manner which will hereinafter be explained. The juxtaposition of the multiple contact carrier members is best shown in FIGS. 1, 2 and 3.

Figure 7:
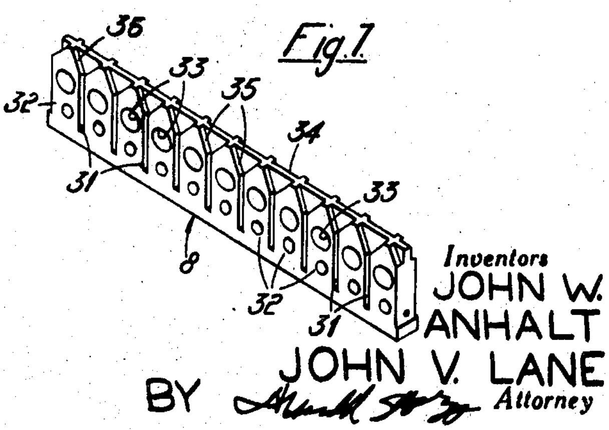
FIG. 7 is a perspective view of a cam support rail shown apart from the electrical connector assembly.

Referring to FIGS. 1 and 7, each cam support bar possesses an elongated configuration, generally rectangular in cross section, formed with a plurality of longitudinally spaced transversely extending parallel grooves or passageways 31 on at least one side of the bar, but preferably on both sides thereof, in opposed relationship. The grooves 31 divide the elongated bar into a plurality of joined segments 32, each segment having a bore 33 extending transversely therethrough and functioning as a journal having an axis perpendicular to the long axis of the elongated cam support bar 8. As shown best in FIG. 7, each groove 31 has a depth less than the thickness of the bar so that adjacent segments 32 are joined, in effect, by an integral web 34 which also forms the bottom of each groove. It should be noted that in one embodiment of the invention the length of the grooves is less than the width of the bar, and that at one end each groove intercepts an edge of the bar, and adjacent the intercepted edge the sidewalls 35 of each groove are divergent to provide easy access and guide means for lugs 29 into each groove.

In the relationship of the cam support bars and contact carrier members illustrated best in FIG. 1, the elongated cam support bars are disposed across the ends of the juxtaposed contact carrier members so that each pair of lugs 29 on the end of each contact carrier member engage adjacent grooves 31 formed in the contact support bar. Each contact carrier member is thus independently and precisely supported and positioned with respect to the axis of bore 33, which, as previously explained, extends perpendicular to the long axis of the cam support bar.

As shown best in FIGS. 2, 3 and 4, each of the grooves 27 disposed between adjacent partitions 24 on each wall 22 of the contact carrier member 9 is proportioned to receive therewithin a resilient metallic electrical conductor designated generally by the numeral 36, and including adjacent its outer extremity tubular ferule portion 37, a resilient tine 38 struck from the body of the ferule and projecting out of the circular plane thereof to provide a free end 39 adapted to abut against a shoulder 41 formed by a projection 42 extending into passageway 27 in the portion thereof which extends through bottom wall 21 of the contact carrier member. On its inner end, the electrical conductor 36 provided with a resilient contact portion 43 normally lying in the space between adjacent partitions 24. The resilient contact portion is provided with a contact nodule 44 intermediate its ends and lying adjacent to edges 26 of the partitions but within their outer limits. The extreme end of the resilient contact 43 is provided with a resilient lever section 46 on the end of which is formed a cam nodule 47.

As shown best in FIGS. 2, 3 and 4, each contact carrier member is provided with opposed series of separate resilient contact members enclosed within opposed grooves 27. Each resilient contact member of each pair, in its normally unbiased position, lies wholly within the groove formed between adjacent partitions 24 so that the opposed contact nodules 44 do not extend past the edges 26 of the pr partitions into the passageway 23 formed therebetween. In this manner the edge portion of a printed circuit board (FIG. 2) or the blade portion of a plug connector (FIGS. 3 and 4), may be inserted into the passageway 23 without the imposition of any force because the contact nodules 44 do not constitute an impediment to such insertion.

In FIGS. 3 and 4, instead of the edge portion of a printed circuit board 50, the support blade portion 48 of an electrical plug connector 49, supporting individual electrical conductors 51 having contact terminal portions 52, is inserted into the passageway 23 so that the contact terminals 52 lie therewithin in association with adjacent resilient contact members 43 and contact nodules 44. In this position of the parts, electrical contact between the printed circuit board terminals or contact terminals 52 and the associated resilient contact members 43 does not exist, and both the printed circuit board board and the plug connector 49 may be inserted into the contact carrier socket member without the exertion of force.

With the contact carrier socket members 9 interengaged with cam support bars 8 as shown best in FIG. 1, it will be seen (FIGS. 2 and 3) that juxtaposed contact carrier members have defined between them a semicircular elongated depression or trough formed by the concave surfaces 28 of back-to-back partitions 24. Lying within this elongated trough is an elongated camshaft 56, opposite ends of which are journaled in the bores 33 of opposed cam support bars 8. In the embodiment illustrated in FIG. 1, each camshaft extends between adjacent rows or resilient contact members 43 supported on juxtaposed contact carrier member in back-to-back relation, as shown best in FIGS. 2 and 3. Each camshaft is provided at spaced intervals along its length with lobes 58 constituting high points on the cam which merge smoothly with flat recessed surfaces 59 constituting low points on the cam. As illustrated in the left-hand portion of FIG. 2, with the cam rotated so that opposed lobes 58 abut cam follower nodules 47, the pair of opposed back-to-back resilient contacts 43 are resiliently biased outwardly so that the contact nodules 44 engage the associated contact terminals of a printed circuit board (FIG. 2) or the associated contact terminals 52 of an electrical plug 49. The parts are proportioned so that sufficient pressure is imposed on the contact nodules 44 to crush and penetrate the oxide film which normally forms on electrical contact surfaces.

As shown in the right-hand portion of FIG. 2, when the camshaft is turned so that the flat surfaces 59 lie in opposition to the associated resilient contact members 43, the inherent resilience of the contact members 43 cause the resilient contacts to be retracted into grooves 27 within the limits of edges 26 of the partitions so that no portion of the contact projects into the passageway 23 to act as an impediment to insertion of a printed circuit board or plug connector.

Figure 5:
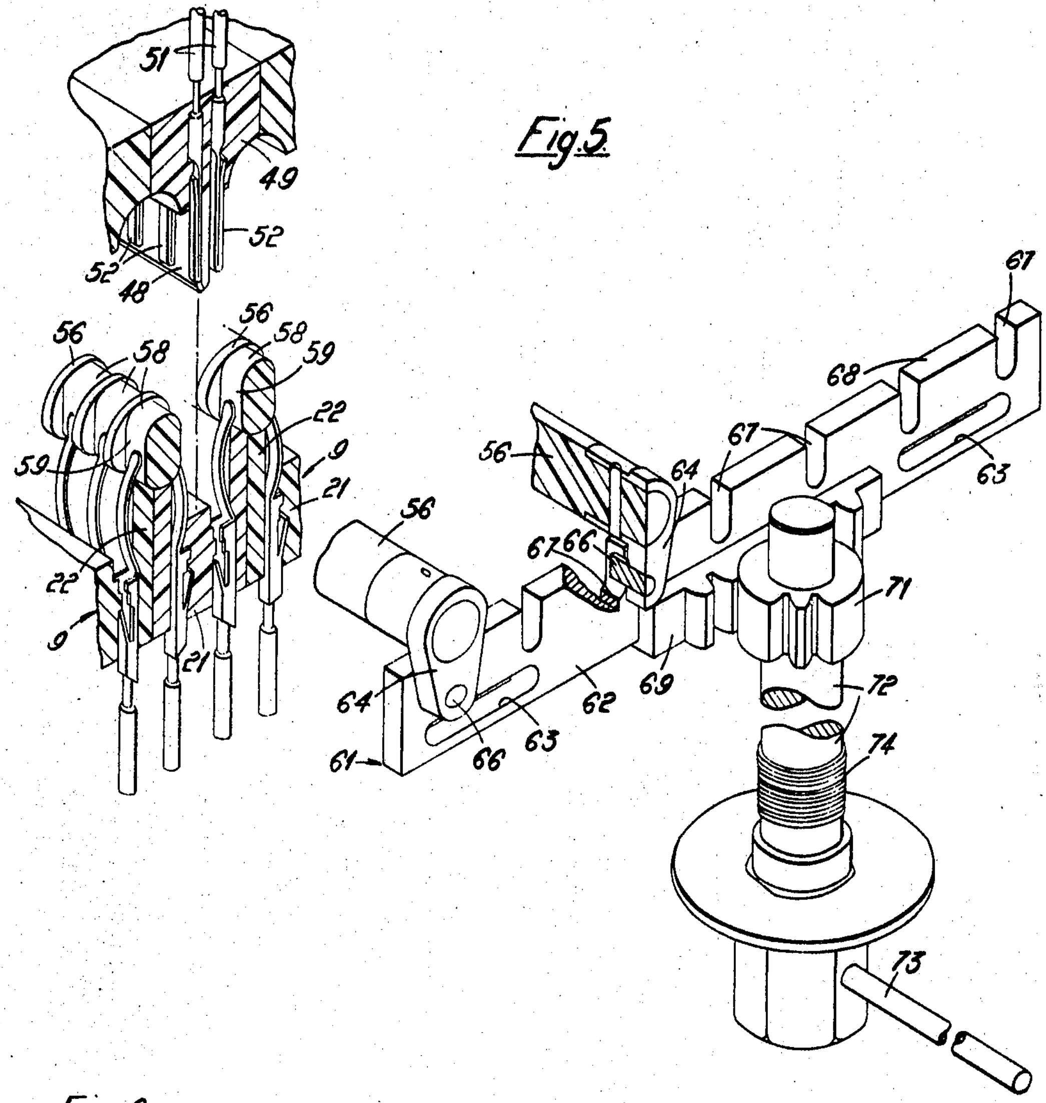
FIG. 5 is a fragmentary schematic view in perspective illustrating the connector assembly shown in FIG. 3, in conjunction with a rack and pinion mechanism interconnecting a plurality of camshafts to effect simultaneous displacement of separate or adjacent rows of electrical contact fingers into electrical engagement with plug-supported individual electrical conductors of the flat variety. Portions of the structure are broken away and omitted for clarity.

Referring to FIG. 5, in the embodiment of the invention there illustrated schematically, the multiplicity of parallel camshafts are interconnected to effect simultaneous lateral displacement of the resilient contact members into engagement with the printed circuit board terminals or, as illustrated, with the contact terminals of an electrical plug connector.

The interconnection means is designated generally by the numeral 61 and comprises a drive plate 62 disposed substantially parallel to one of the cam support bars 8, or, in its absence, perpendicular to the contact carrier members. The drive plate is attached to the side of the printed circuit board file by means of appropriate capscrews (not shown) working in slots 63. Each camshaft 56 is pivotally joined to the drive plate by a bellcrank 64 appropriately secured to each associated camshaft. Each bellcrank at its end remote from the camshaft is provided with a stud shaft 66 projecting parallel to the associated camshaft and adapted to be rotatably disposed in vertical slots 67 formed in the upper edge 68 of the drive plate as shown. Axial displacement of the drive plate will thus effect pivotal movement of the bellcranks, with consequent rotary movement of the camshafts to effect simultaneous transverse displacement of the resilient contact members supported in association with the camshafts. Axial displacement of the drive plate is effected by a toothed rack 69 which meshes with pinion gear 71 mounted on drive shaft 72, which in turn is appropriately connected to an actuating handle 73. The drive shaft 72 is preferably biased by spring 74 to retain the drive plate at one extreme or the other, preferably in a position corresponding to the position of the camshaft illustrated in the right-hand portion of FIGS. 2 and 5 in which the surfaces 59 of the camshaft lie opposed to the associated resilient contact members.

From the foregoing it will be apparent that assembly of the packaging system described above, including insertion of the individual camshafts into the electrical connector assembly 7, is extremely simple because the camshafts may be inserted into the elongated semicircular troughs formed by adjacent contact carriers without concern that as it is inserted the camshaft will impinge and perhaps bend one of the electrical contacts 43. The semicircular ends of the partitions thus function to guide insertion of each camshaft into the assembly.

As illustrated in FIGS. 2, 3 and 4, the concept of zero insertion force electrical connection is applicable not only to printed circuit boards, as illustrated in FIG. 1, but is applicable also to electrical connectors of the plug type which utilize either flat or cylindrical pin-type electrical contact members.

It has been found that where this zero insertion force concept is used with printed circuit boards, damage to printed circuit board pads or terminals is eliminated. Additionally, the concept provides for accommodation of boards varying in thickness, for example from .054 inch to .070 inch, with excellent assurance of good electrical contact. It has also been found that the zero insertion force system insures the imposition of sufficient pressure on each of the contact nodules 44 to crush and penetrate any oxide film that may normally form on the contacts. For instance, for copper contacts, 130 kg./mm.$^2$ is required to crush the oxide film. Electrical contact can be achieved with much lower forces, however, if there is present in the contacting process a "wiping action." Experiments with the present structure have shown that when a 0.05 mm. radius contact nodule is moved across a surface at a velocity of 0.01 cm./sec., a 1 g. load is sufficient to make suitable contact. Thus, high pressure, as imposed by the structure described herein, coupled with the slightest "wiping action", provides double assurance of a high reliability connection. In the instant design, it has been found convenient to proportion the parts so that each contact nodule imposes a nominal force of 750 g. with a measured contact surface engagement area of $67 \times 10^{-4}$ mm.$^2$, to provide a calculated pressure of 112 kg./mm.$^2$. When each contact member 43 impinges the associated printed circuit board terminal pad, a minimum "wiping action" of 0.5 mm. occurs. From this it will be observed that excellent electrical connection is assured even if no "wiping action" occurs, with the added assurance that with the "-wiping action" described, positive electrical contact with a minimum of contact resistance will be effected.

We claim:

1. As an article of manufacture, a contact carrier member for use in an electrical socket connector assembly, comprising an elongated bar generally U-shaped in cross section to provide a bottom wall joined by upstanding sidewalls spaced apart to provide a passageway therebetween to receive a plug connector, each said sidewall having formed thereon a series of longitudinally spaced transversely extending partitions the free edges of opposed partitions defining said passageway, and a series of passageways extending through the bottom wall and communicating with the spaces defined by said partitions between the sidewalls, each said partition extending beyond the entire free ends of the sidewalls and formed with a concave surface proportioned so that when two contact carrier members are juxtaposed the concave surfaces of opposed partitions have a common center of revolution.

2. In combination, an electrical contact carrier member comprising an elongated bar generally U-shaped in cross-section to provide a bottom wall joined by upstanding parallel sidewalls spaced apart, each said sidewall having formed thereon a series of longitudinally spaced transversely extending opposed partitions the free edges of which define a longitudinally extending passageway parallel to the sidewalls, a series of passageways extending through the bottom wall and communicating with the spaces defined between adjacent partitions of each series, and an elongated electrical conductor extending through each said passageway and including a resilient contact portion normally lying in the space between adjacent partitions within the U-shaped member, said combination further comprising a plug connector having a body portion and a blade portion adapted to be inserted into the passageway defined by the opposed partitions in the contact carrier member, and electrical terminals fixed on the plug connector and disposed on the blade portion thereof in noncontacting juxtaposition to the resilient contact portion when the blade portion of the plug connector is initially inserted into the U-shaped carrier member.